US010614333B2

(12) United States Patent
Lee

(10) Patent No.: US 10,614,333 B2
(45) Date of Patent: Apr. 7, 2020

(54) METHOD FOR READING GRAPHICAL INDICATOR, INDICATOR STRUCTURE AND ELECTRONIC APPARATUS THEREOF

(71) Applicant: SONIX Technology Co., Ltd., Hsinchu (TW)

(72) Inventor: Cheng-Ta Lee, Taichung (TW)

(73) Assignee: SONIX Technology Co., Ltd., Hsinchu (TW)

( * ) Notice: Subject to any disclaimer, the term of this patent is extended or adjusted under 35 U.S.C. 154(b) by 811 days.

(21) Appl. No.: 15/011,674

(22) Filed: Feb. 1, 2016

(65) Prior Publication Data

US 2017/0109595 A1      Apr. 20, 2017

(30) Foreign Application Priority Data

Oct. 19, 2015   (CN) .......................... 2015 1 0679413

(51) Int. Cl.
*G06K 9/20*       (2006.01)
*G06T 7/11*       (2017.01)
(Continued)

(52) U.S. Cl.
CPC ......... *G06K 9/2054* (2013.01); *G06K 9/4642* (2013.01); *G06T 7/11* (2017.01);
(Continued)

(58) Field of Classification Search
CPC .......... G06K 19/06037; G06K 7/1417; G06K 7/1456; G06K 7/14; G06K 2009/226; G06K 19/06009; G06F 3/0321; G06F 3/03545
(Continued)

(56) References Cited

U.S. PATENT DOCUMENTS

| 4,604,065 A | 8/1986 | Frazer et al. |
| 4,627,819 A | 12/1986 | Burrows |

(Continued)

FOREIGN PATENT DOCUMENTS

| CA | 2374808 | 12/2000 |
| CN | 1458619 | 11/2003 |

(Continued)

OTHER PUBLICATIONS

VTech's Preliminary Invalidity Contentions from the litigation, Nov. 12, 2010, pp. 1-164.
(Continued)

*Primary Examiner* — Thien M Le
*Assistant Examiner* — Tae W Kim
(74) *Attorney, Agent, or Firm* — JCIPRNET

(57) ABSTRACT

A method for reading a graphical indicator is provided. The method includes the following steps. An indicator image including a plurality of graphical micro-units is obtained. According to a portion of the graphical micro-units, a first header part and a first content data part belonging to a first image indicator are obtained. According to another portion of the graphical micro-units, a second header part and a second content data part belonging to a second image indicator are obtained. The graphical micro-units of the first content data part are further used to obtain the indicator data. When a portion of the graphical micro-units in the first content data part is lost, the complete graphical micro-units can be obtained by recovering the lost graphical micro-units of the first content data part according to the graphical micro-units belonging to the first and the second content data parts captured in the indicator image.

18 Claims, 9 Drawing Sheets

(51) Int. Cl.
  *G06K 9/46* (2006.01)
  *H03M 13/05* (2006.01)
  *H03M 13/00* (2006.01)
  *H03M 13/09* (2006.01)

(52) U.S. Cl.
  CPC ......... *H03M 13/05* (2013.01); *H03M 13/611* (2013.01); *G06K 2209/03* (2013.01); *H03M 13/09* (2013.01)

(58) Field of Classification Search
  USPC ....................................................... 235/494
  See application file for complete search history.

(56) References Cited

U.S. PATENT DOCUMENTS

| | | |
|---|---|---|
| 4,869,532 A | 9/1989 | Abe et al. |
| 4,889,365 A | 12/1989 | Chouinard |
| 4,891,011 A | 1/1990 | Cook |
| 4,924,078 A | 5/1990 | Sant'Anselmo et al. |
| 5,051,736 A | 9/1991 | Bennett et al. |
| 5,221,833 A | 6/1993 | Hecht |
| 5,234,798 A | 8/1993 | Heninger et al. |
| 5,329,108 A | 7/1994 | Lamoure |
| 5,369,261 A | 11/1994 | Shamir |
| 5,416,312 A | 5/1995 | Lamoure |
| 5,473,536 A | 12/1995 | Wimmer |
| 5,568,555 A | 10/1996 | Shamir |
| 5,577,774 A | 11/1996 | Morikawa et al. |
| 5,591,957 A | 1/1997 | Morikawa et al. |
| 5,612,524 A | 3/1997 | Sant'Anselmo et al. |
| 5,686,705 A | 11/1997 | Conroy et al. |
| 5,729,731 A | 3/1998 | Yajima et al. |
| 5,852,434 A | 12/1998 | Sekendur |
| 5,866,895 A | 2/1999 | Fukuda et al. |
| 5,877,458 A | 3/1999 | Flowers |
| 5,896,403 A | 4/1999 | Nagasaki et al. |
| 5,905,250 A | 5/1999 | Fukuda et al. |
| 5,945,656 A | 8/1999 | Lemelson et al. |
| 5,951,056 A | 9/1999 | Fukuda et al. |
| 5,959,285 A | 9/1999 | Schuessler |
| 6,052,813 A | 4/2000 | Nagasaki et al. |
| 6,058,498 A | 5/2000 | Nagasaki et al. |
| 6,094,279 A | 7/2000 | Soscia |
| 6,102,505 A | 8/2000 | McIntyre et al. |
| 6,144,956 A | 11/2000 | Yajima et al. |
| 6,208,771 B1 | 3/2001 | Jared et al. |
| 6,229,964 B1 | 5/2001 | Bell |
| 6,244,764 B1 | 6/2001 | Lei et al. |
| 6,325,420 B1 | 12/2001 | Zhang et al. |
| 6,354,630 B1 | 3/2002 | Zhang et al. |
| 6,412,695 B1 | 7/2002 | Reber et al. |
| 6,441,921 B1 | 8/2002 | Soscia |
| 6,460,766 B1 | 10/2002 | Olschafskie et al. |
| 6,473,762 B1 | 10/2002 | Knoblock et al. |
| 6,502,756 B1 | 1/2003 | Fahraeus |
| 6,533,182 B1 | 3/2003 | Ohshima et al. |
| 6,548,768 B1 | 4/2003 | Pettersson et al. |
| 6,556,690 B1 | 4/2003 | Nelson |
| 6,559,690 B2 | 5/2003 | Waldrop |
| 6,570,104 B1 | 5/2003 | Ericson et al. |
| 6,586,688 B2 | 7/2003 | Wiebe |
| 6,663,008 B1 | 12/2003 | Pettersson et al. |
| 6,666,376 B1 | 12/2003 | Ericson |
| 6,674,427 B1 | 1/2004 | Pettersson et al. |
| 6,689,966 B2 | 2/2004 | Wiebe |
| 7,017,806 B2 | 3/2006 | Peterson |
| 7,172,131 B2 | 2/2007 | Pettersson et al. |
| 7,182,247 B1 | 2/2007 | Lapstum et al. |
| 7,248,250 B2 | 7/2007 | Pettersson et al. |
| 7,281,668 B2 | 10/2007 | Pettersson et al. |
| 7,328,845 B2 | 2/2008 | Tsai |
| 7,549,579 B2 | 6/2009 | Overhultz et al. |
| 7,549,597 B2 | 6/2009 | Tsai et al. |
| 7,669,774 B2 | 3/2010 | Tsai |
| 7,726,570 B2 | 6/2010 | Tsai |
| 7,819,330 B2 | 10/2010 | Tsai et al. |
| 8,002,198 B2 | 8/2011 | Tsai |
| 8,006,913 B2 | 8/2011 | Tsai |
| 8,851,391 B2 | 10/2014 | Tsai |
| 2002/0020750 A1 | 2/2002 | Dymetman et al. |
| 2002/0125319 A1 | 9/2002 | Sasaki et al. |
| 2004/0032505 A1 | 2/2004 | Silverbrook et al. |
| 2005/0173544 A1 | 8/2005 | Yoshida |
| 2006/0076416 A1 | 4/2006 | Pettersson |
| 2007/0023523 A1 | 2/2007 | Onishi |
| 2007/0164110 A1 | 7/2007 | Yoshida |
| 2008/0245869 A1* | 10/2008 | Berkun ................ G06K 7/14 235/462.1 |
| 2008/0252916 A1 | 10/2008 | Huang |
| 2009/0230193 A1* | 9/2009 | Al-Hussein ........ G06K 7/10722 235/462.11 |
| 2010/0044445 A1 | 2/2010 | Kiliccote |
| 2011/0262047 A1 | 10/2011 | Wei |
| 2014/0163474 A1* | 6/2014 | Draper .............. A61M 5/31551 604/189 |
| 2015/0358500 A1 | 12/2015 | Lee et al. |

FOREIGN PATENT DOCUMENTS

| | | |
|---|---|---|
| CN | 1464480 | 12/2003 |
| CN | 1695158 | 11/2005 |
| CN | 1877607 | 12/2006 |
| CN | 1311410 | 4/2007 |
| CN | 1326017 C | 7/2007 |
| CN | 101064013 | 10/2007 |
| CN | 101615259 | 12/2009 |
| CN | 101882019 | 11/2010 |
| CN | 102609748 | 7/2012 |
| CN | 102622599 | 8/2012 |
| CN | 101064013 A * | 11/2012 |
| CN | 102324039 | 9/2014 |
| CN | 104156924 | 11/2014 |
| CN | 101908156 | 12/2014 |
| CN | 105069388 | 11/2015 |
| DE | 10255926 | 8/2006 |
| EP | 0626660 | 11/1994 |
| EP | 0660261 | 6/1995 |
| EP | 0764944 | 3/1997 |
| EP | 0887765 | 12/1998 |
| EP | 0907139 | 4/1999 |
| EP | 1876552 | 1/2008 |
| EP | 1895447 | 3/2008 |
| EP | 2439677 | 4/2012 |
| EP | 2618287 | 7/2013 |
| EP | 2953059 | 12/2015 |
| FR | 2834806 | 7/2003 |
| GB | 2384094 | 9/2004 |
| GB | 2396042 | 12/2004 |
| JP | H09-031382 | 2/1997 |
| JP | 09-226228 | 9/1997 |
| JP | 10-257309 | 9/1998 |
| JP | 10-261058 | 9/1998 |
| JP | H10-251570 | 9/1998 |
| JP | H11-112787 | 4/1999 |
| JP | 2000-022930 | 1/2000 |
| JP | 2001-096889 | 4/2001 |
| JP | 2001-346032 | 12/2001 |
| JP | 2001-353955 | 12/2001 |
| JP | 2004-166177 | 6/2004 |
| JP | 2007-011890 | 1/2007 |
| JP | 2007-012016 | 1/2007 |
| JP | 2007-288756 | 11/2007 |
| JP | 2008-109531 | 5/2008 |
| JP | 2008-205559 | 9/2008 |
| JP | 2008-210402 | 9/2008 |
| JP | 2010-206433 | 9/2010 |
| JP | 2012-256375 | 12/2012 |
| JP | 2013-020648 | 1/2013 |
| JP | 2013-150289 | 8/2013 |
| JP | 2014-090424 | 5/2014 |
| JP | 2015-080251 | 4/2015 |
| KR | 10-20050028040 | 3/2005 |
| KR | 10-0989319 | 10/2010 |

(56) References Cited

FOREIGN PATENT DOCUMENTS

| | | |
|---|---|---|
| KR | 10-1007348 | 1/2011 |
| TW | 581970 | 4/2004 |
| TW | 200739452 | 10/2007 |
| TW | 200951823 | 12/2009 |
| TW | 201013541 | 4/2010 |
| TW | 201137758 | 11/2011 |
| TW | I370413 | 8/2012 |
| TW | I370414 | 8/2012 |
| TW | I428834 | 3/2014 |
| TW | I492167 | 7/2015 |
| WO | 9408314 | 4/1994 |
| WO | 0051072 | 8/2000 |
| WO | 0073981 | 12/2000 |
| WO | 2004029871 | 4/2004 |
| WO | 2004084125 | 9/2004 |
| WO | 2006117869 | 11/2006 |

OTHER PUBLICATIONS

Request for Reexamination of the '845 patent filed on Jan. 19, 2011 by sunplus, pp. 1-149.

The initial determination opening the Reexamination of the '845 patent, dated Feb. 18, 2011, pp. 1-16.

"Presentation of publications of prior art indicating a reason for refusal on the application provided by third party, received by the Japanese Patent Office on Jan. 28, 2011", with partial English translation thereof, in which the listed 2nd-4th foreign references were cited, total 2 pages.

"Presentation of publications of prior art indicating a reason for refusal on the application provided by third party, received by the Japanese Patent Office on Feb. 3, 2011", with partial English translation thereof, in which the listed references were cited, total 6 pages.

"Handschrift Per Funk in Die Ganze Welt", Weka Fachzeitschriftenverlag, Poing, De. Vil. 49, No. 16, pp. 74-76, in German.

"E-Commerce mit Stift auf Papier", CT Magazin Fuer Computer Technik, Heise Zeitschriften Verlag, pp. 22, in German.

David L. Hecht, "Printed Embedded Data Graphical User Interfaces", IEEE Service Center, vol. 34, No. 3, Mar. 2001, pp. 47-51 and 54.

Chu; Ying et al, "A new method for generating, processing, and displaying complex graphics," Application Research of Computers vol. 1992 No. 2, Feb. 28, 1992, pp. 27-30.

"Office Action of China Counterpart Application," dated Apr. 26, 2018, pp. 1-8.

\* cited by examiner

METHOD FOR READING GRAPHICAL INDICATOR, INDICATOR STRUCTURE AND ELECTRONIC APPARATUS THEREOF

CROSS-REFERENCE TO RELATED APPLICATION

This application claims the priority benefit of Chinese application serial no. 201510679413.1, filed on Oct. 19, 2015. The entirety of the above-mentioned patent application is hereby incorporated by reference herein and made a part of this specification.

BACKGROUND

Field of the Invention

The invention is directed to a method for reading a graphical indicator, an indicator structure applicable to the reading method and an electronic apparatus thereof, and more particularly, to a method for reading a graphical indicator which remains operable even when the whole graphical indicator is not completely captured in an indicator image, an indicator structure applicable to the reading method and an electronic apparatus thereof.

Description of Related Art

With the progress in printing techniques and electronic technologies, a technique of hiding graphical indicators in visible text information or graphic information has been widely applied in our daily life. FIG. 1A is a schematic diagram illustrating the graphical indicator coexisting with main information in the related art. Referring to FIG. 1A, a graphical indicator 102 is formed on an object surface 100. The graphical indicator 102 is composed of a plurality of graphical micro-units; the graphical micro-units are tiny and thus, visibly ignored easily or interpreted as a background by human eyes. The graphical indicator 102 and main information 104 (e.g., a text pattern "APPLE" illustrated in FIG. 1) are formed together by means of, for example, printing on the object surface 100, which may be paper, for example. The graphical indicator 102 is corresponding to indicator data and does not influence the human eyes on receiving the main information 104.

FIG. 1B is a schematic diagram illustrating the graphical indicators in the related art, in which a conventional pattern design includes a plurality of graphical indicators 102. Referring to FIG. 1B, one graphical indicator 102 (the region surrounded by a dashed line) is formed by a header area 112 and a content data area 114 according to a predetermined rule. To be detailed, the header area 112 of each of the graphical indicator 102 may facilitate in distinguishing the graphical indicators 102 from one another, and the content data area 114 carries different information by graphical micro-units 116. Generally, the graphical indicator 102 has to be read by a specific electronic system and transformed into digital data, so as to obtain additional information hidden therein. Take FIG. 1A and FIG. 1B for example, the electronic system captures an enlarged image of part of the object surface by an optical device, obtains the graphical indicator 102 from the enlarged image to transform it into the digital data and obtains the additional information corresponding to the digital data. In the related art, the electronic system has to be capable of interpreting the complete graphical indicator 102, so as to correctly obtain the additional information. However, in some circumstances (e.g., the optical device shifts), the electronic system becomes incapable of reading the complete graphical indicator 102 and therefore, cannot obtain the corresponding additional information. Thus, how to correctly obtain the additional information related to the aforementioned graphical indicator in case the graphical indicator is incompletely captured remains one of the issues to be solved by the technicians of the art.

SUMMARY

Accordingly, the invention provides a method for reading a graphical indicator, an indicator structure and an electronic apparatus thereof, which can correctly obtain indicator data corresponding to the graphical indicator under a situation that the graphical indicator is incompletely captured.

According to an embodiment of the invention, a method for reading a graphical indicator adapted to an electronic apparatus for reading a graphical indicator in an indicator structure is provided. The graphical indicator includes a header part and a content data part. The graphical indicator reading method includes the following steps. An indicator image is obtained, and the indicator image includes a plurality of graphical micro-units. According to a portion of the graphical micro-units, a first header part and a first content data part belonging to a first graphical indicator are obtained. According to another portion of the graphical micro-units, a second header part and a second content data part belonging to a second graphical indicator are obtained. The graphical micro-units belonging to the first content data part are further used to obtain indicator data corresponding to the first graphical indicator. When a portion of the graphical micro-units in the first content data part is lost, the lost graphical micro-units of the first content data part are estimated according to the graphical micro-units belonging to the first content data part and the second content data part captured in the indicator image, so as to obtain the complete graphical micro-units of the first content data part.

According to an embodiment of the invention, an indicator structure applicable to the aforementioned method for reading the graphical indicator is provided. The indicator structure includes a plurality of graphical indicators configured on a medium and each of the graphical indicators corresponds to indicator data. Each of the graphical indicators includes a content data part and a header part. Each content data part includes a plurality of data block, and each of the data blocks has a graphical micro-unit, which is selectively and respectively configured in one of a plurality of unit positions of the data block to indicate a segment value, and the indicator data is combined by the segment values. The header part includes a plurality of graphical micro-units, and the graphical micro-units are arranged in a predetermined manner to provide header information for identifying the graphical indicator. According to a relatively positional relationship between the first graphical indicator and the second graphical indicator in the indicator structure, the segment values indicated by the data blocks having consistent positions in the first graphical indicator and in the second graphical indicator have a corresponding relationship.

According to an embodiment of the invention, an electronic apparatus for reading a graphical indicator in an indicator structure is provided. The graphical indicator includes a content data part and a header part. The electronic apparatus includes an image capture device and a processing device. The image capture device obtains an indicator image including a plurality of graphical micro-units. The processing device obtains a first header part and a first content data part belonging to a first graphical indicator according to a portion of the graphical micro-units and obtains a second header part and a second content data part belonging to a second graphical indicator according to another portion of the graphical micro-units. The graphical micro-units belonging to the first content data part are further used to obtain indicator data corresponding to the first graphical indicator. When a portion of the graphical micro-units in the first content data part is lost, the lost graphical micro-units of the first content data part are estimated according to the graphical micro-units belonging to the first content data part and the second content data part captured in the indicator image by the processing device, so as to obtain the complete graphical micro-units of the first content data part.

Based on the above, in the method for reading the graphical indicator, the indicator structure and the electronic apparatus is provided by the invention, and in case of the first graphical indicator is not totally covered in the indicator image. The first graphical indicator is incompletely covered in the indicator image is estimated according to at least a portion of the second graphical indicators that is also covered in the indicator image. To be more detailed, a mathematical relation exists between the indicator data corresponding to the first graphical indicator and the indicator data corresponding to the second graphical indicators surrounding the first graphical indicator. Accordingly, even though the first graphical indicator is not completely covered in the indicator image, the indicator data corresponding to the first graphical indicator still can be obtained by using the first graphical indicator and the second graphical indicators covered in the indicator image.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
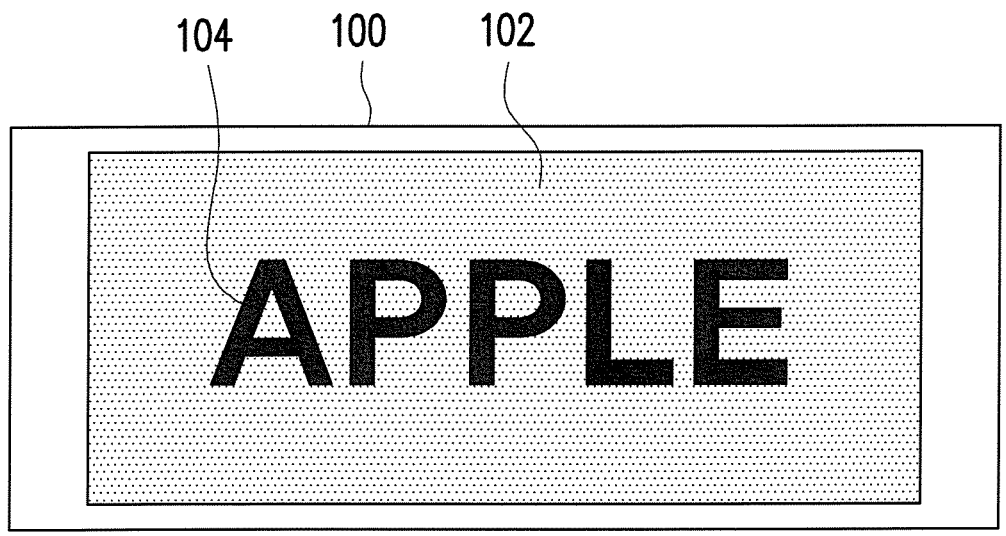
FIG. 1A is a schematic diagram illustrating the graphical indicator coexisting with main information in the related art.
Figure 1B:
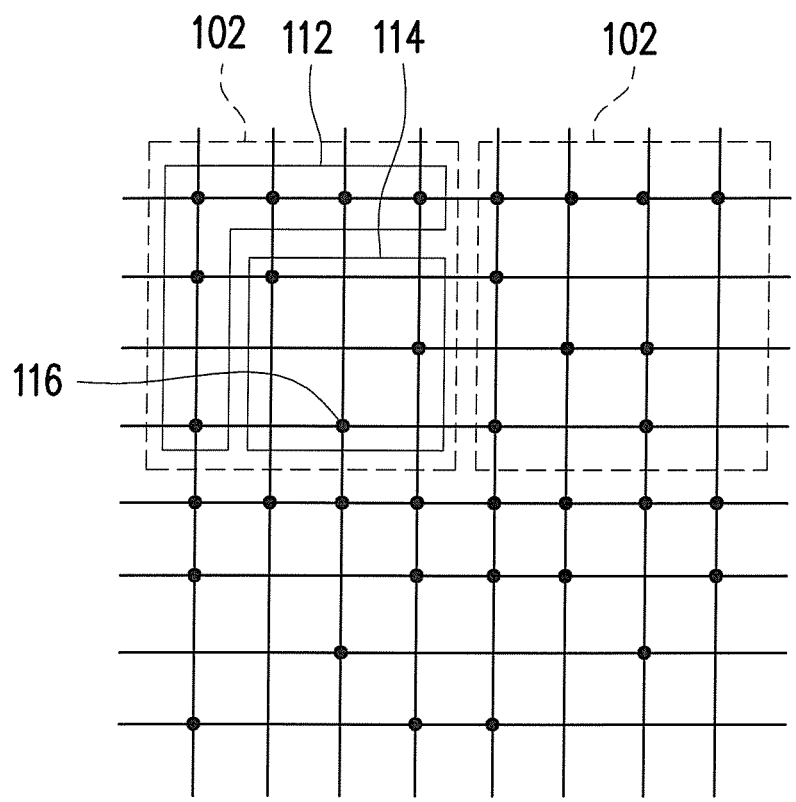
FIG. 1B is a schematic diagram illustrating the graphical indicators in the related art.
Figure 2:
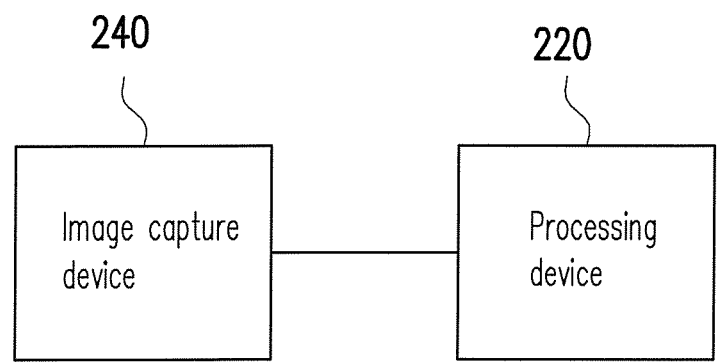
FIG. 2 is a block diagram illustrating an electronic apparatus according to an embodiment of the invention.

FIG. 2 is a block diagram illustrating an electronic apparatus according to an embodiment of the invention. Referring to FIG. 2, an electronic apparatus 200 of the present embodiment includes an image capture device 220 and a processing device 240, which is configured to read an indicator structure including a plurality of graphical indicators and obtain indicator data corresponding to the graphical indicators. To be more detailed, the image capture device 220 is, for example, a charge-coupled device (CCD) or a complementary metal-oxide semiconductor (CMOS) image sensor, and the processing device 240 is, for example, a single-core or multi-core central processing unit (CPU) or other general or specific programmable microprocessor, digital signal processor (DSP), programmable controller, application specific integrated circuits (ASIC), programmable logic device (PLD), any other similar device, or a combination thereof.

Figure 3A:
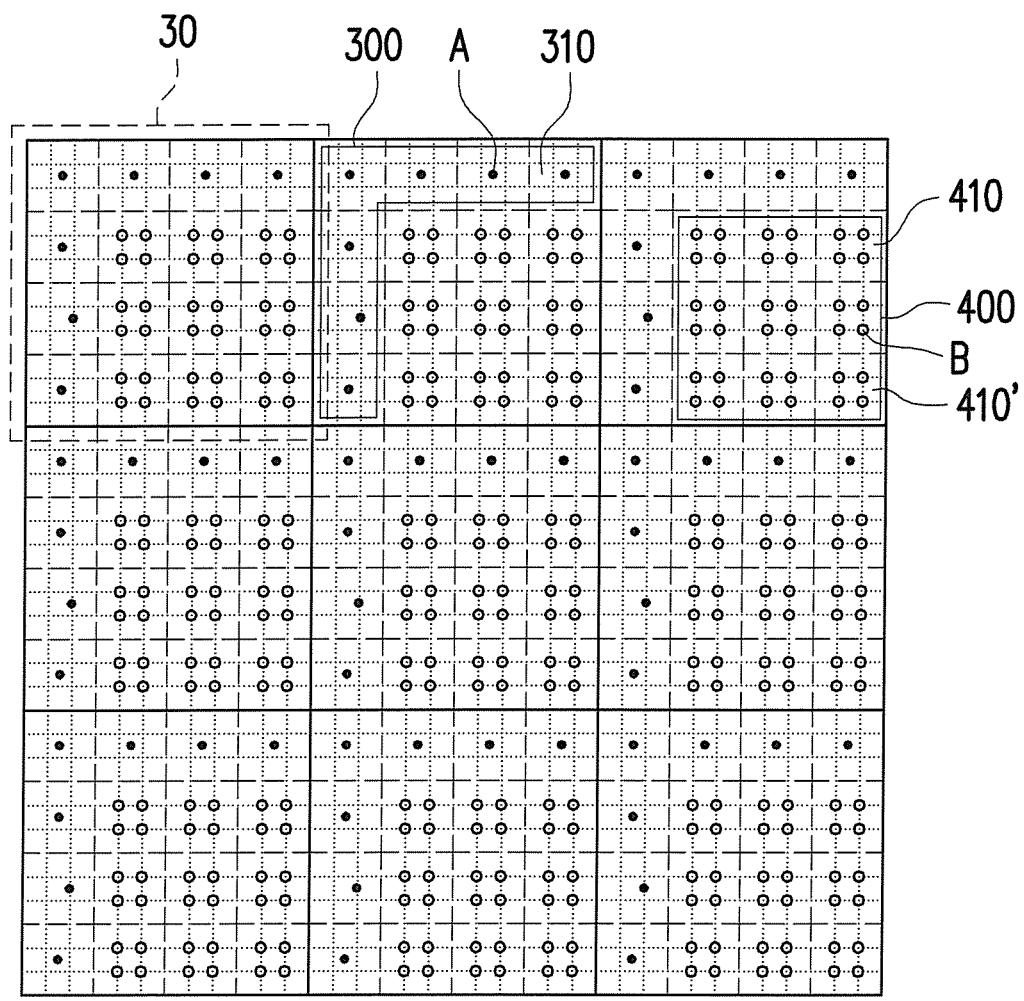
FIG. 3A to FIG. 3D are schematic diagrams illustrating an indicator structure according to an embodiment of the invention.

FIG. 3A to FIG. 3D are schematic diagrams illustrating an indicator structure according to an embodiment of the invention. Referring to FIG. 3A, in the present embodiment, an indicator structure 10 includes a plurality of different graphical indicators 30 arranged in an array and each corresponds to an indicator data. Generally, the graphical indicators 30 are configured on different media (not shown), such as paper books, plastic billboards, wooden billboards and so on. Each of the graphical indicators 30 further includes a header part 300 and a content data part 400. The header part 300 includes a plurality of graphical micro-units A, and the graphical micro-units A are arranged in a predetermined manner to provide header information for identifying the graphical indicators 30. To be more detailed, the header part 300 is divided into a plurality of header blocks 310, and a graphical micro-unit A is configured in each of the header blocks 310. Each of the graphical indicators 30 is generally composed of the graphical micro-units A and B in the header part 300 and the content data part 400, and thus, the header part 300 configured in each graphical indicator structure may facilitate the electronic apparatus 200 in accurately orienting the graphical indicators 30 after capturing an indicator image. The header part 300 further defines a distribution area of the graphical micro-units B in the content data part 400 within each graphical indicator.

Each content data part 400 includes a plurality of data blocks 410, and each of the data blocks 410 has at least one graphical micro-unit B, and each of the graphical micro-units B is selectively and respectively configured on one of a plurality of unit positions of the data blocks 410 to indicate a segment value. Taking FIG. 3A for example, each of the data blocks 410 includes 4 unit positions, in which the graphical micro-units B may be placed, and respectively indicate segment values 00, 01, 10 and 11, but the invention is not limited thereto, and the unit positions may be configured according to an upper limit of segment values to be carried by a single data block. The indicator data corresponding to each of the graphical indicators 30 is combined by the segment values indicated by the data blocks 410.

Figure 3B:
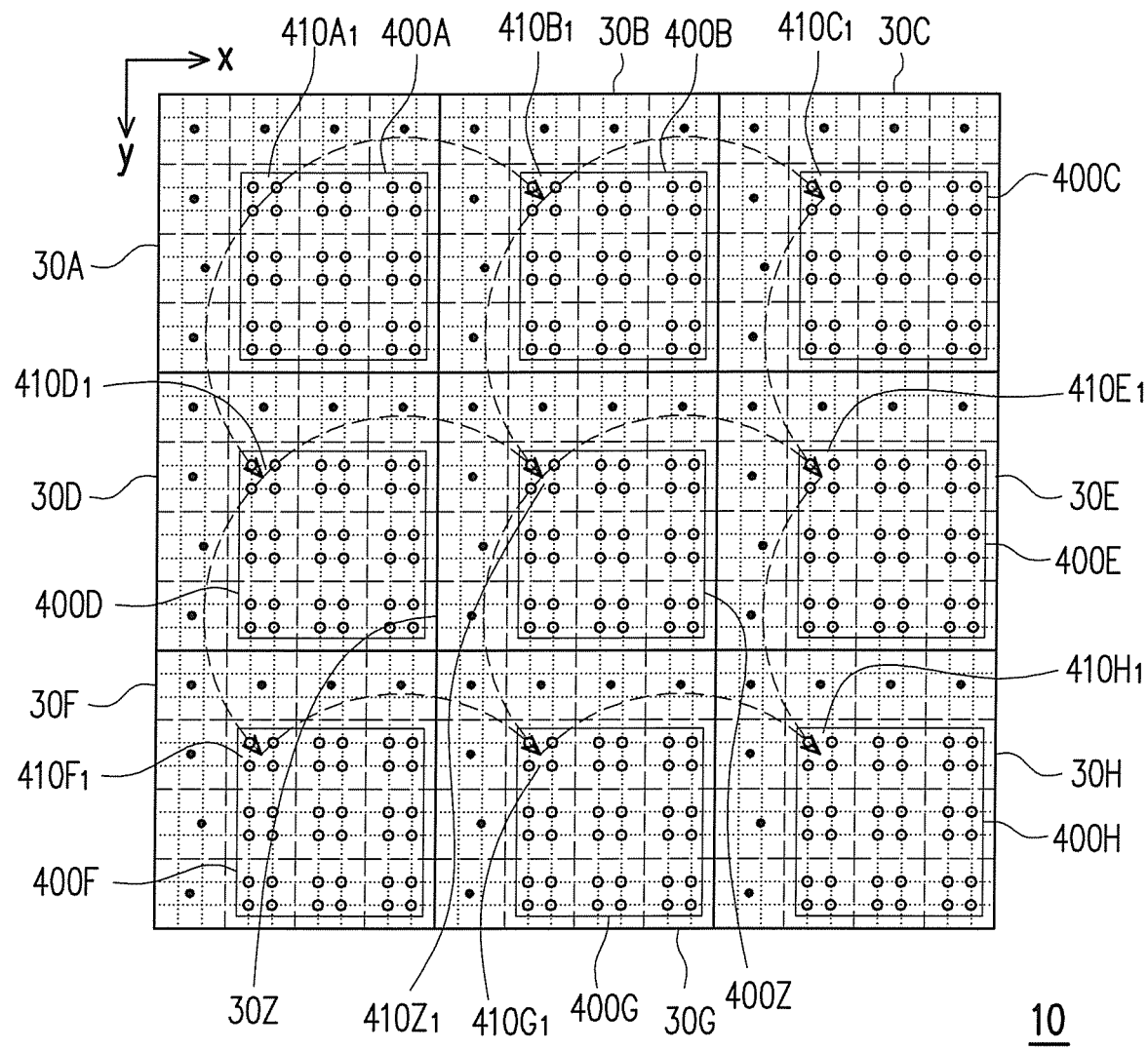
Figure 3C:
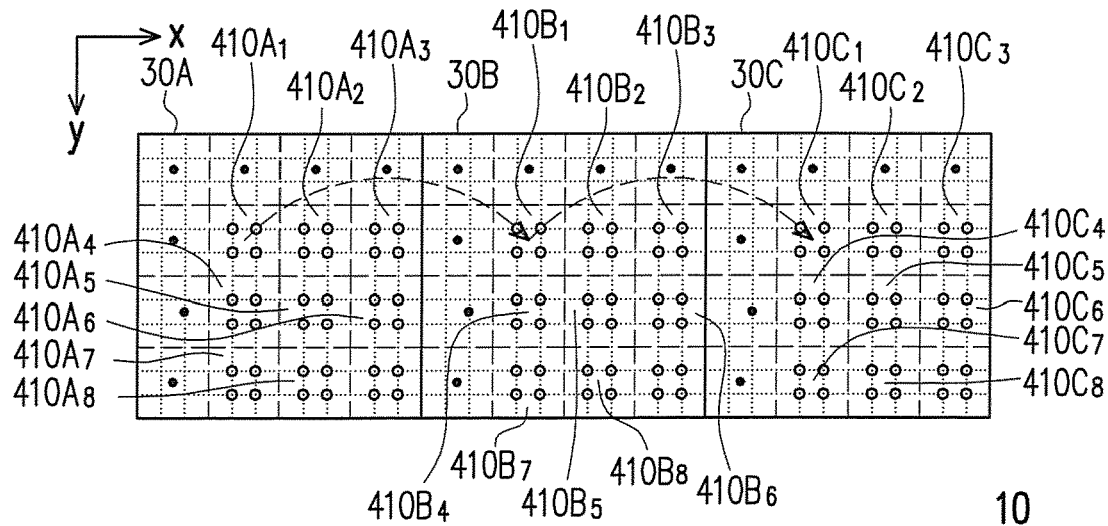
Figure 3D:
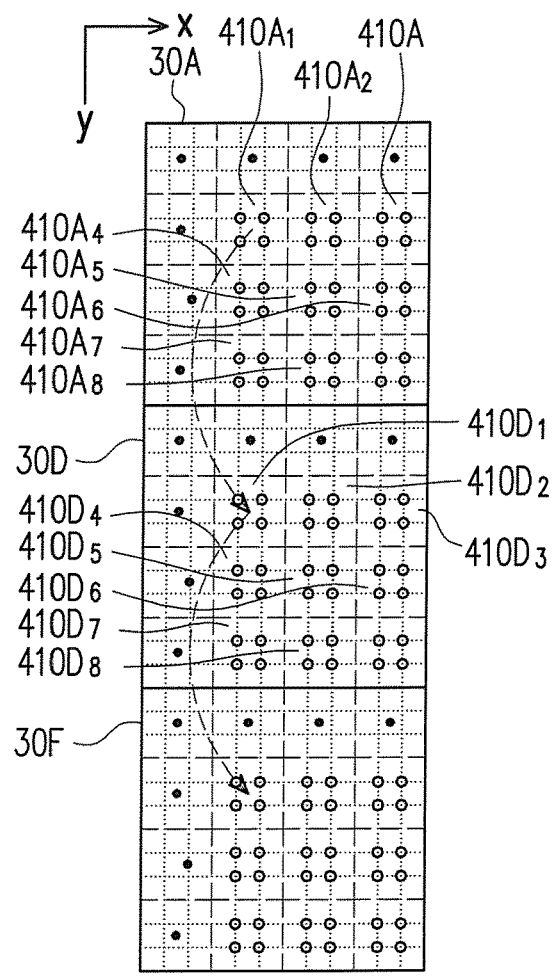

For descriptive convenience, in FIG. 3B to FIG. 3D and the following drawings, the graphical indicators are given different item names and referral numerals, which include a first graphical indicator 30Z and second graphical indicators 30A to 30H. In the present embodiment, the first graphical indicator 30Z and the second graphical indicators 30A to 30H are arranged in an array, and according to a relatively positional relationship between the first graphical indicator 30Z and its adjacent second graphical indicators 30A to 30H on the indicator structure 10, the segment values indicated by a data block $410Z_1$ and data blocks $410A_1$ to $410H_1$ having consistent positions in the first graphical indicator 30Z and the second graphical indicators 30A to 30H have a corresponding relationship. Therefore, in the data blocks $410Z_1$, $410A_1$ to $410H_1$, according to the segment value of any one of the data blocks, it is able to correspondingly compute the segment values of the other data blocks. For example, the segment values indicated by the data blocks $410Z_1$, $410B_1$ to $410H_1$ may be computed from the segment value indicated by the data block $410A_1$, or the segment value indicated by the data block $410A_1$ may be computed from the segment values indicated by the data blocks $410B_1$, $410D_1$. To be more detailed, the indicator data corresponding to the graphical indicators 30 that may be combined by all the segment values in the content data part 400 have been illustrated in the embodiment of FIG. 3A. In other words, it represents that when the first graphical indicator 30Z and the surrounding second graphical indicators 30A to 30H are configured, the indicator data respectively corresponding thereto are configured according to a mathematical relation.

Taking a two-dimensional graphical indicator structure 10 illustrated in FIG. 3B and FIG. 3C, for example, after the second graphical indicator 30A is configured, a segment value indicated by each of the data blocks $410B_1$, $410B_3$, $410B_5$ and $410B_7$ of a second content data part 400B in the second graphical indicator 30B may be obtained by adding the segment value indicated by each of the data blocks $410A_1$, $410A_3$, $410A_5$ and $410A_7$ of the second content data part 400A with an offset value (where the offset value is 1, for example), and a segment value indicated by each of the data blocks $410B_2$, $410B_4$, $410B_6$ and $410B_8$ of a second content data part 400B in the second graphical indicator 30B may be the segment value indicated by each of the data blocks $410A_2$, $410A_4$, $410A_6$ and $410A_8$ of the second content data part 400A.

Still, referring to FIG. 3B and FIG. 3C, a segment value indicated by each of the data blocks $410C_1$, $410C_3$, $410C_5$ and $410C_7$ of a second content data part 400C in the second graphical indicator 30C may be obtained by adding the segment value indicated by each of the data blocks $410A_1$, $410A_3$, $410A_5$ and $410A_7$ of the second content data part 400A with twice the offset value (where the offset value is 1, for example), and a segment value indicated by each of the data blocks $410C_2$, $410C_4$, $410C_6$ and $410C_8$ of the second content data part 400C in the second graphical indicator 30C may be the segment value indicated by each of the data blocks $410A_2$, $410A_4$, $410A_6$ and $410A_8$ in the second content data part 400A.

Similarly, taking the two-dimensional graphical indicator structure 10 illustrated in FIG. 3B and FIG. 3D for example, a segment value indicated by each of the data blocks $410D_1$, $410D_3$, $410D_5$ and $410D_7$ of a second content data part 400D in the second graphical indicators 30D may be the segment value indicated by each of the data blocks $410A_1$, $410A_3$, $410A_5$ and $410A_7$ of the second content data part 400A, and a segment value indicated by each of the data blocks $410D_2$, $410D_4$, $410D_6$ and $410D_8$ of the second content data part 400D in the second graphical indicators 30D may be obtained by adding the segment value indicated by each of the data blocks $410A_2$, $410A_4$, $410A_6$ and $410A_8$ of the second content data part 400A with an offset value (where the offset value is 1, for example).

In other words, when the first graphical indicator 30Z and the second graphical indicators 30A to 30H are configured with the second graphical indicator 30A as the original point and the first graphical indicator 30Z and the second graphical indicators 30B to 30H as the rest being configured, the segment values indicated by a portion of the data blocks of the second content data part 400A in the second graphical indicator 30A are correspondingly adjusted by using an offset value according to displacement variations of the first graphical indicator 30Z and the second graphical indicators 30B to 30H on the X axis, and the segment values indicated by another portion of the data blocks of the second content data part 400A in the second graphical indicator 30A are correspondingly adjusted by using an offset value according to displacement variations of the first graphical indicator 30Z and the second graphical indicators 30B to 30H on the Y axis; however, the adjustment using the offset value is not limited to the addition operation. Apparently, the segment values indicated by the data block $410Z_1$ and the $410A_1$ to $410H_1$ having the consistent positions in the first graphical indicator 30Z and in the second graphical indicators 30A to 30H also have the corresponding relationship. The embodiments illustrated in FIG. 3A to 3D are illustrated for describing how the first graphical indicator 30Z and the plurality of second graphical indicators 30A to 30H are configured to achieve the segment values indicated by the data blocks 410 having the consistent positions in the first content data part 400Z of the first graphical indicator 30Z and the second content data parts 400A to 400H of the second graphical indicators 30A to 30H to have the corresponding relationship; however the invention is not limited to the embodiment illustrated in FIG. 3B. Moreover, the offset value may be, for example, an arbitrary integer.

Referring to FIG. 3A again, in an embodiment of the invention, data block 410' in the content data part 400 is, for example, a parity check block, and a segment value indicated by the data block 410' is a bit check value which may be used to performing a parity check on the indicator data corresponding to the graphical indicator. However, the invention is not limited thereto. In another embodiment of the invention, data block 410', for example, a cyclic redundancy check (CRC) block, and the segment value indicated by the data block 410' is an error-detecting code which may be used to performing an error detection on the indicator data corresponding to the graphical indicator.

Figure 4:
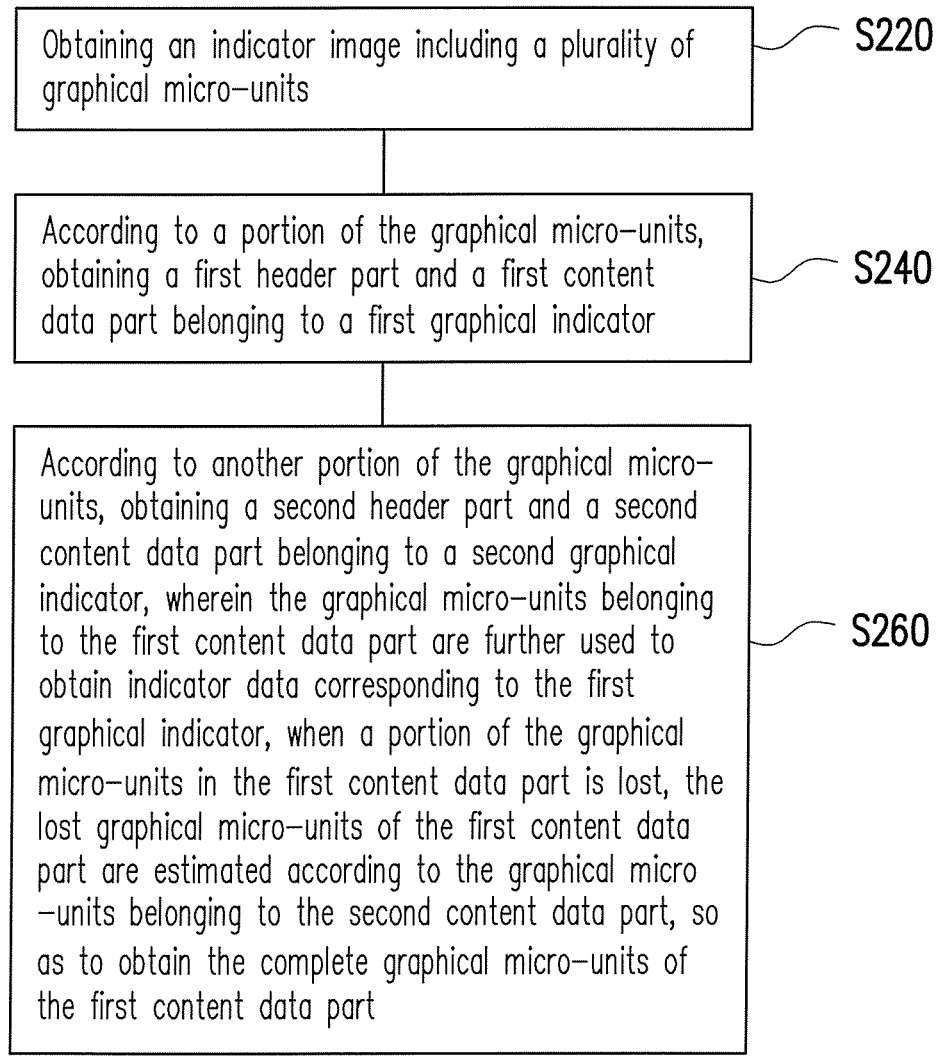
FIG. 4 is a flowchart illustrating a method for reading a graphical indicator according to an embodiment of the invention.

FIG. 4 is a flowchart illustrating a method for reading a graphical indicator according to an embodiment of the invention. Referring to FIG. 4, the method of the present embodiment is applicable to the electronic apparatus 200 depicted in FIG. 2 and the indicator structure 10 illustrated in FIG. 3A and FIG. 3B, and is configured for reading the indicator data corresponding to the graphical indicator. The description with respect to the method for reading the graphical indicator of the invention will be set forth below with reference to each element of the electronic apparatus 200. In step S220, the image capture device 220 of the electronic apparatus 200 obtains an indicator image, and the indicator image includes a plurality of graphical micro-units. Then, in step S240, the processing device 240 obtains a first header part and a first content data part belonging to a first graphical indicator according to a portion of the graphical micro-units. In step S260, the processing device 240 obtains a second header part and a second content data part belonging to a second graphical indicator according to another portion of the graphical micro-units. The graphical micro-units belonging to the first content data part are further used to obtain indicator data corresponding to the first graphical indicator. When a portion of the graphical micro-units in the first content data part is lost, the processing device 240 estimates the lost graphical micro-units of the first content data part according to the graphical micro-units belonging to the second content data part, so as to obtain complete graphical micro-units of the first content data part.

Figure 5A:
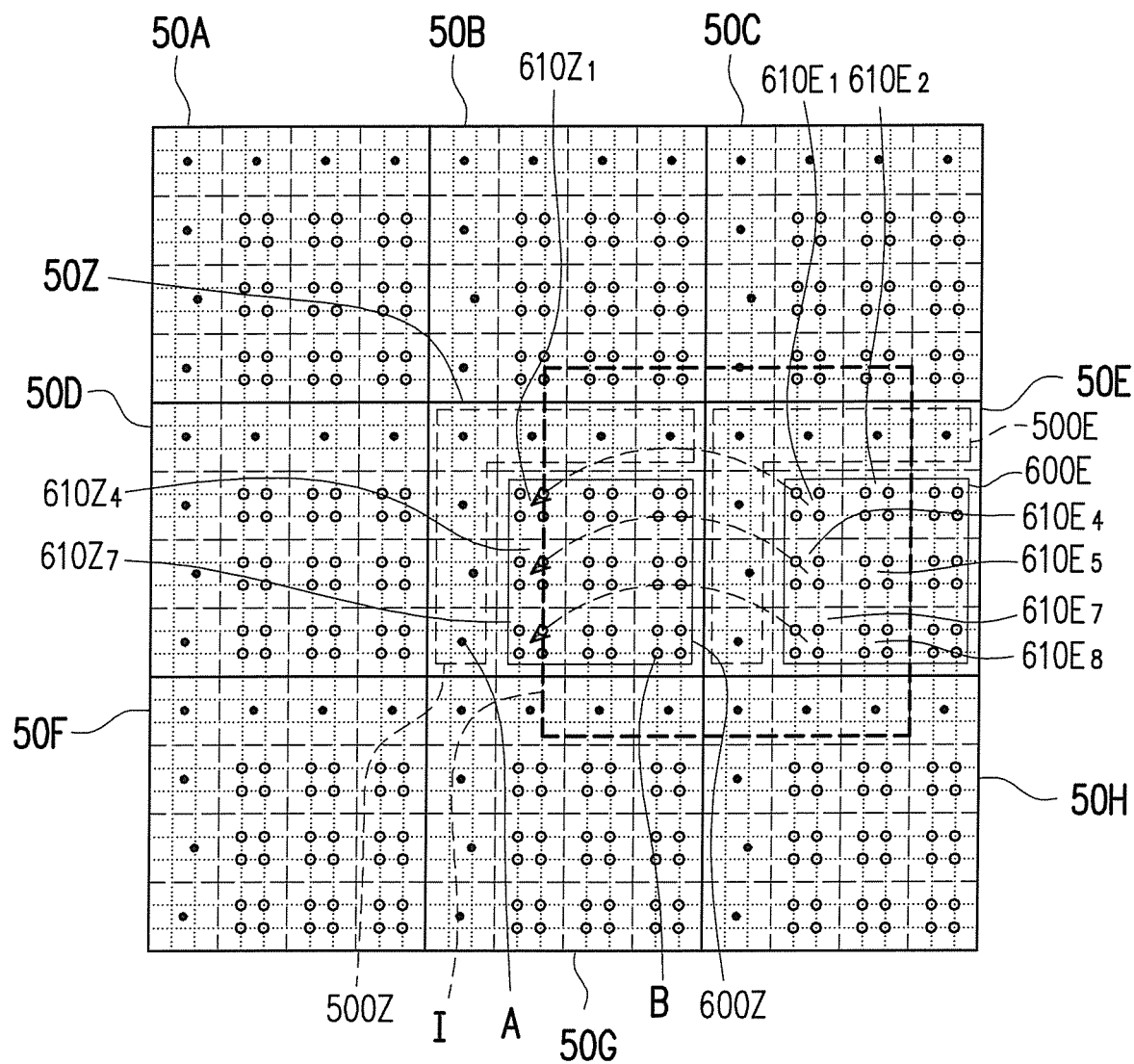
FIG. 5A, FIG. 5B and FIG. 5C are schematic diagrams illustrating an indicator image according to an embodiment of the invention.
Figure 5B:
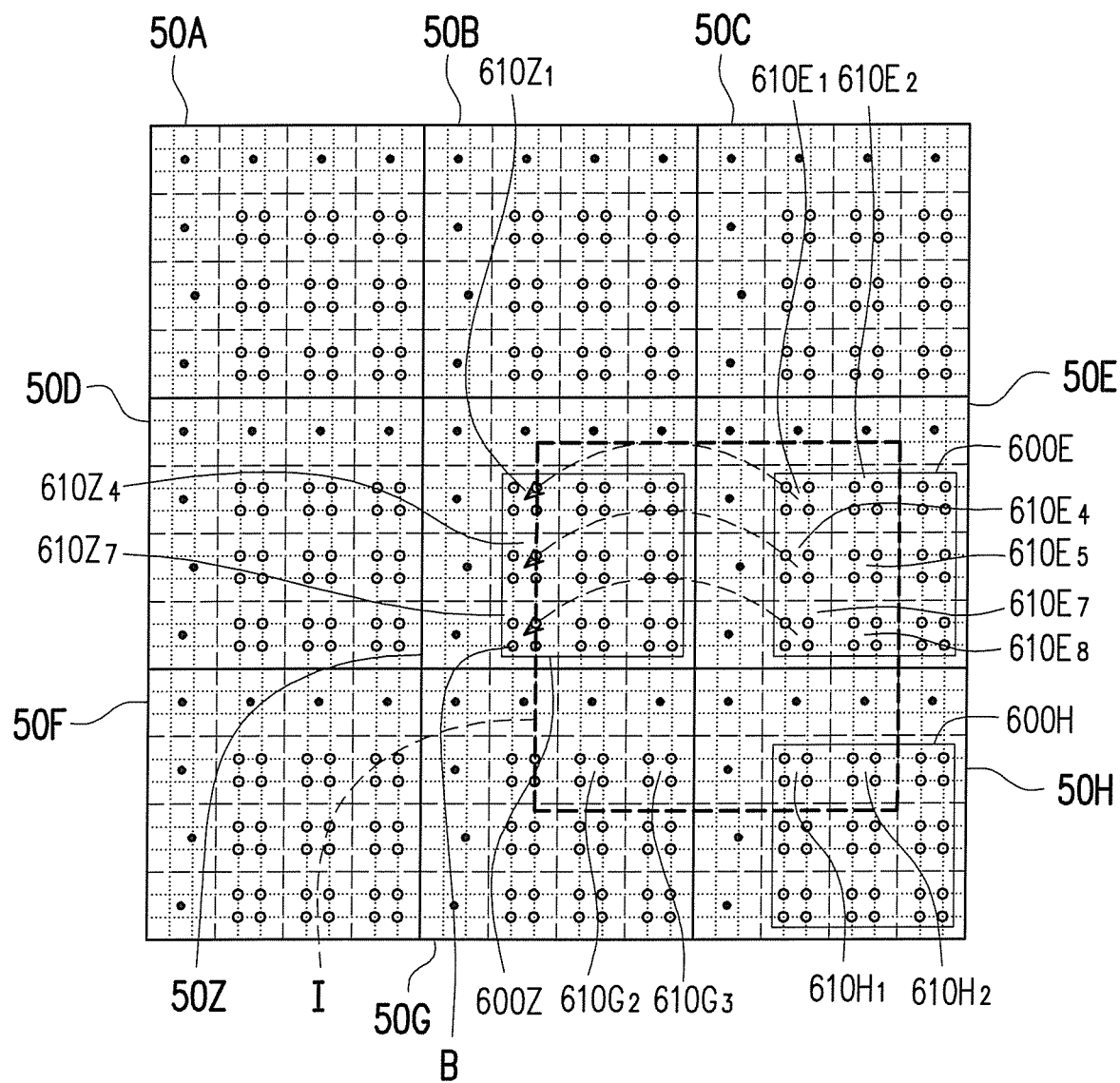
Figure 5C:
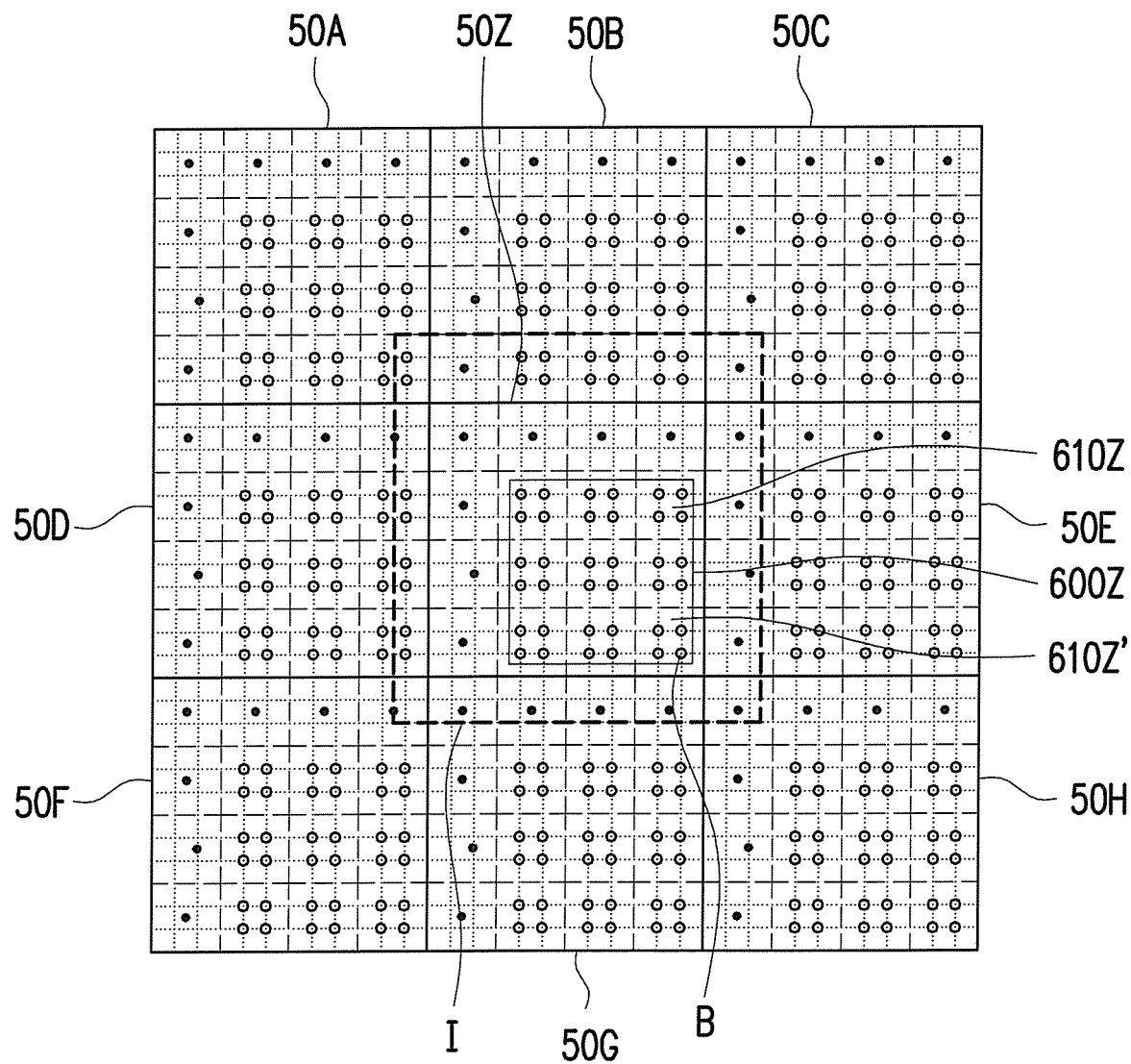

FIG. 5A, FIG. 5B and FIG. 5C are schematic diagrams illustrating an indicator image according to an embodiment of the invention. Referring to FIG. 5A, an indicator image I covers part of an indicator structure, and the coverage includes part of a first graphical indicator 50Z and part of a second graphical indicator 50E. In an embodiment of the invention, the processing device 240 first obtains the indicator image I, and the indicator image I contains a plurality of graphical micro-units A and B. The processing device 240 first identifies a first header part 500Z and a first content data part 600Z belonging to a first graphical indicator 50Z according to the graphical micro-units A and B contained in the indicator image I. It should be noted that as illustrated in FIG. 5A, the first header part 500Z may not be totally covered in the indicator image I. However, in the indicator structure, the header part of each graphical indicator (including the first graphical indicator 50Z and second graphical indicators 50A to 50H) has graphical micro-units arranged in the same manner. Thus, the processing device 240 may infer the first header part 500Z belonging to the first graphical indicator 50Z according to the header part covered in the indicator image I (e.g., the part of the first header part 500Z and the part of the second header part 500E covered in the indicator image I illustrated in FIG. 5A). Similarly, the processing device 240 may also identify the second header part 500E belonging to the second graphical indicator 50E in the manner as described above.

After obtaining the first header part 500Z, the processing device 240 further obtains the graphical micro-units B belonging to the first content data part 600Z covered in the indicator image I. Similarly, after obtaining the second header part 500E, the processing device 240 also obtains the graphical micro-units B belonging to the second content data part 600E covered in the indicator image I according to the second header part 500E. Thereafter, the processing device 240 determines the graphical micro-units in all the data blocks of the first content data part 600Z to obtain indicator data corresponding to the first graphical indicator 50Z. Likewise, the first content data part 600Z may not be totally covered in the indicator image I; however, on the basis that segment values indicated by the data block having consistent positions in the first graphical indicator 50Z and the second graphical indicators 50A to 50H adjacent to the first graphical indicator 50Z have a corresponding relationship, the processing device 240 may estimate the graphical micro-units B in the data blocks $610Z_1$, $610Z_4$ and $610Z_7$ uncovered in the indicator image I, but belonging to the first content data part 600Z by using the graphical micro-units B in the first graphical indicator 50Z and the second graphical indicator 50E and their data blocks $610Z_2$, $610Z_3$, $610Z_5$, $610Z_6$, $610Z_8$, $610Z_9$, $610E_1$, $610E_2$, $610E_4$, $610E_5$, $610E_7$, and $610E_8$ covered in the indicator image I, so as to repair and estimate the indicator data corresponding to the first graphical indicator 50Z. In other words, all the graphical micro-units B captured in the indicator image I are used for repairing and estimating the indicator data corresponding to the first graphical indicator 50Z. It should be noted that the data blocks $610E_1$, $610E_2$, $610E_4$, $610E_5$, $610E_7$ and $610E_8$ belong to the second content data part 600E of the second graphical indicator 50E.

Referring to FIG. 5B, in another embodiment of the invention, the indicator image I may cover a plurality of second graphical indicators 50E, 50G, 50H and the data blocks $610E_1$, $610E_2$, $610E_4$, $610E_5$, $610E_7$, $610E_8$, $610G_2$, $610G_3$, $610H_1$ and $610H_2$ thereof. In this case, if the processing device 240 intends to estimate the graphical micro-unit B in the first graphical indicator 50Z uncovered in the indicator image I, but belonging to the data block $610Z_1$ in the first content data part 600Z, the graphical micro-units B in the data blocks $610Z_2$, $610Z_3$, $610Z_5$, $610Z_6$, $610Z_8$, $610Z_9$, $610E_1$, $610E_2$, $610E_4$, $610E_5$, $610E_7$, $610E_8$, $610G_2$, $610G_3$, $610H_1$ and $610H_2$ may be used to estimate the graphical micro-units B in the data block $610Z_1$, and determine the segment value indicated by the data block $610Z_1$ by comparing the estimation results. The data blocks $610E_1$, $610E_2$, $610E_4$, $610E_5$, $610E_7$, $610E_8$, $610G_2$, $610G_3$, $610H_1$ and $610H_2$ are respectively belong to the second content data parts 600E, 600G and 600H of the second graphical indicators 50E, 50G and 50H. According to an embodiment of the invention, the process of comparing the estimation results is as follows. The graphical micro-unit B of the data block $610Z_1$ estimated respectively by using the data blocks $610E_1$, $610E_2$, $610E_4$, $610E_5$, $610E_7$, $610E_8$ and the data blocks $610H_1$, $610H_2$ do not have to be further compared if indicating the same segment value. Otherwise, the graphical micro-unit B of the data block $610Z_1$ estimated respectively by using the data blocks $610E_1$, $610E_2$, $610E_4$, $610E_5$, $610E_7$, $610E_8$ and the data blocks $610H_1$, $610H_2$, if indicating different segment values, may be determined according to the number of the adjacent graphical micro-units of the data blocks $610E_1$, $610H_1$ in the indicator image I. In the invention, if the graphical micro-units adjacent to the graphical micro-unit in the data block belonging to the second content data part are in a greater number, it represents that the segment value of the data block belonging to the first content data part which estimated by the data block belonging to the second content data part are more reliable. In other words, data blocks belonging to different second content data parts and their graphical micro-units may also be used to estimate and repair the corresponding data blocks belonging to the same first content data part and their graphical micro-units as if the positions of the data blocks belonging to the second graphical indicator used for repairing and estimating the first graphical indicator are consistent with the positions of the data blocks uncovered in the indicator image in the first graphical indicator. Lastly, according to the repaired and estimated first graphical indicator 50Z, the corresponding indicator data may be obtained.

Referring to FIG. 5C, in the present embodiment, if the indicator image I totally covers all of the data block 610Z and the graphical micro-units B in the content data part 600Z of the first graphical indicator 50Z, the processing device 240 may obtain the corresponding indicator data directly from the graphical micro-units B covered in the indicator image I that belong to the first content data part 600Z. It should be noted that the coverage of the indicator image I has to be at least greater than a graphical indicator, such that the processing device 240 may successfully read the indicator data corresponding to one first graphical indicator 50Z.

Furthermore, referring to FIG. 5C, data block 610Z' in the content data part (e.g., the first content data part 600Z) is, for example, a parity check block, and a segment value indicated by the data block 610Z' is a bit check value used for performing a parity check on the indicator data corresponding to the graphical indicator 50Z. However, the invention is not limited thereto. In another embodiment, the data block 610Z', for example, a cyclic redundancy check (CRC) block, and the segment value indicated by the data block 610Z' is an error-detecting code which may be used to performing an error detection on the indicator data corresponding to the graphical indicator. After step S260 is done, and the indicator data is obtained, the processing device 240 determines whether the indicator data in the first graphical indicator passes the parity check according to a parity check block in the first graphical indicator or a parity check block in the second graphical indicator, so as to further confirm whether the obtained indicator data is correct. To be more detailed, indicator data corresponding to the second graphical indicator and indicator data corresponding to the first graphical indicator have a mathematical relation, and thus, if the indicator image contains the parity check block of the second graphical indicator, the processing device 240 transforms the indicator data corresponding to the first graphical indicator into the indicator data corresponding to the second graphical indicator and performs the parity check to confirm correctness of the indicator data.

To summarize, in the method for reading the graphical indicator, the indicator structure and the electronic apparatus provided by the invention, in case of a portion of the graphical micro-units is lost in the first graphical indicator of the indicator image, the graphical micro-units of the second graphical indicator which are also covered in the indicator image are used to estimate the graphical micro-units of the first graphical indicator that are uncovered in the indicator image. To be more detailed, in the indicator structure, a mathematical relation exists between the indicator data corresponding to the first graphical indicator and the indicator data corresponding to the second graphical indicators surrounding the first graphical indicator. Accordingly, even though the first graphical indicator is not completely covered in the indicator image, the indicator data corresponding to the first graphical indicator still can be obtained by using the first graphical indicator and the second graphical indicators covered in the indicator image.

Although the invention has been described with reference to the above embodiments, it is apparent to one of the ordinary skill in the art that modifications to the described embodiment may be made without departing from the spirit of the invention. Accordingly, the scope of the invention is defined by the attached claims not by the above detailed descriptions.

What is claimed is:

1. A method for reading a graphical indicator, adapted to an electronic apparatus to read a graphical indicator in an indicator structure, wherein the graphical indicator comprises a header part and a content data part, wherein the header part and the content data part each comprise a plurality of graphical micro units, the method comprising:

obtaining an indicator image comprising graphical micro-units from a plurality of graphical indicators;

obtaining a portion of a first header part and a portion of a first content data part belonging to a first graphical indicator by reading first graphical micro-units captured in the indicator image, wherein the first graphical micro-units belong to the first graphical indicator; and obtaining a portion of a second header part and a portion of a second content data part belonging to a second graphical indicator by reading second graphical micro-units captured in the indicator image, wherein the second graphical micro-units belong to the second graphical indicator, wherein the first content data part comprises a plurality of first data blocks, each of the first data blocks has one of the first graphical micro-units, wherein a position of each of the first graphical micro-units in each of the first data blocks indicated a first segment value of each of the first data blocks, and the first segment values of all the first data blocks are combined to make up first indicator data corresponding to the first graphical indicator; and the second content data part comprises a plurality of second data blocks, each of the second data blocks has one of the second graphical micro-units, wherein a position of each of the second graphical micro-units in each of the second data blocks indicated a second segment value of each of the second data blocks, and the second segment values of all the second data blocks are combined to make up second indicator data corresponding to the second graphical indicator;

identifying a relative position relationship between the first content data part and the second content data part according to the portion of the first header part and the portion of the second header part;

identifying a corresponding relationship between one of the first data blocks and one of the second data blocks, wherein said one of the first data blocks and that said one of the second data blocks have consistent positions regarding the first content data part and the second content data part, wherein said one of the first data blocks and that said one of the second data blocks are captured in the indicator image, wherein the corresponding relationship between that said one of the first data blocks and that said one of the second data blocks indicates a difference between a first segment value of that said one of the first data blocks and a second segment value of that said one of the second data blocks;

determining a complete set of graphical micro-units belonging to the first content data part by determining further one or more of the first data blocks according to the corresponding relationship and further one or more of the second data blocks, wherein the further one or more of the first data blocks and the further one or more of the second data blocks have consistent further positions regarding the first content data part and the second content data part, wherein the further one or more of the first data blocks are not captured in the indicator image, and the further one or more of the second data blocks are captured in the indicator image, wherein the difference between the first segment value of each of the further one or more of the first data blocks and the second segment value of each of the further one or more of the first data blocks is indicated by the corresponding relationship, wherein the first content data part is different from the second content data part, and the first indicator and the second indicator are different, wherein the complete set of graphical micro-units belonging to the first content data part is further used to obtain the first indicator data corresponding to the first graphical indicator.

2. The method according to claim 1, wherein the content data part comprises a plurality of data blocks, each of the data blocks has one of the graphical micro-units selectively and respectively configured in one of a plurality of unit positions of the data block to indicate a segment value, and the indicator data is combined by the segment values; and the graphical micro-units of the header part are arranged in a predetermined manner to provide header information for identifying the graphical indicator, wherein according to the relative position relationship between the first graphical indicator and the second graphical indicator in the indicator structure, the segment values indicated by the data blocks having consistent positions in the first graphical indicator and in the second graphical indicator have the corresponding relationship.

3. The method according to claim 2, wherein each of the header parts defines a distribution area of the graphical micro-units belonging to the content data part in each of the graphical indicators.

4. The method according to claim 2, wherein the data block in each of the content data parts is a parity check block, and the segment value indicated by the data block is a bit check value used to perform a parity check on the indicator data corresponding to the graphical indicator.

5. The method according to claim 4, further comprising: determining whether the indicator data in the first graphical indicator passes the parity check according to the parity check block in the first graphical indicator or the parity check block in the second graphical indicator.

6. The method according to claim 2, wherein the data block in each of the content data parts is a cyclic redundancy check block, and the segment value indicated by the data block is an error-detecting code used to perform an error detection on the indicator data corresponding to the graphical indicator.

7. The method according to claim 1, wherein a coverage of the indicator image is at least greater than one of the graphical indicators.

8. An indicator structure applicable to the method for reading the graphical indicator recited in claim 1, the indicator structure comprising:
a plurality of graphical indicators configured on a medium, wherein each of the graphical indicators is corresponding to indicator data and comprises:
a content data part, comprising a plurality of data blocks, wherein each of the data blocks has one of graphical micro-units which is selectively and respectively configured in one of a plurality of unit positions of the data block to indicate a segment value, and the indicator data is combined by the segment values; and
a header part, comprising a plurality of the graphical micro-units, wherein the graphical micro-units are arranged in a predetermined manner to provide header information for identifying the graphical indicator,
wherein the graphical indicators comprise a first graphical indicator and a second graphical indicator, and according to the relative position relationship between the first graphical indicator and the second graphical indicator in the indicator structure, the segment values indicated by the data blocks having consistent positions in the first graphical indicator and in the second graphical indicator have the corresponding relationship.

9. The indicator structure according to claim 8, wherein each of the header parts defines a distribution area of the graphical micro-units belonging to the content data part in each of the graphical indicators.

10. The indicator structure according to claim 8, wherein the data block in each of the content data parts is a parity check block, the segment value indicated by the data block is a bit check value used to perform a parity check on the indicator data corresponding to the graphical indicator.

11. The indicator structure according to claim 8, wherein the data block in each of the content data parts is a cyclic redundancy check block, and the segment value indicated by the data block is an error-detecting code used to perform an error detection on the indicator data corresponding to the graphical indicator.

12. An electronic apparatus for reading a graphical indicator in an indicator structure, wherein the graphical indicator comprises a content data part and a header part, wherein the header part and the content data part each comprise a plurality of graphical micro units, the electronic apparatus comprising:
an image capture device, obtaining an indicator image comprising graphical micro-units from a plurality of graphical indicators; and
a processing device, is configured to obtain a portion of a first header part and a portion of a first content data part belonging to a first graphical indicator by first reading graphical micro-units captured in the indicator image, wherein the first graphical micro-units belong to the first graphical indicator,
wherein the processing device is further configured to obtain a portion of a second header part and a portion of a second content data part belonging to a second graphical indicator by reading second graphical micro-units captured in the indicator image, wherein the second graphical micro-units belong to the second graphical indicator,
wherein
the first content data part comprises a plurality of first data blocks, each of the first data blocks has one of the first graphical micro-units, wherein a position of each of the first graphical micro-units in each of the first data blocks indicated a first segment value of each of the first data blocks, and the first segment values of all the first data blocks are combined to make up first indicator data corresponding to the first graphical indicator; and
the second content data part comprises a plurality of second data blocks, each of the second data blocks has one of the second graphical micro-units, wherein a position of each of the second graphical micro-units in each of the second data blocks indicated a second segment value of each of the second data blocks, and the second segment values of all the second data blocks are combined to make up second indicator data corresponding to the second graphical indicator,
wherein the processing device is further configured to identify a relative position relationship between the first content data part and the second content data part according to the portion of the first header part and the portion of the second header part,
wherein the processing device is further configured to identify a corresponding relationship between one of the first data blocks and one of the second data blocks,
wherein said one of the first data blocks and that said one of the second data blocks have consistent positions regarding the first content data part and the second content data part,
wherein said one of the first data blocks and that said one of the second data blocks are captured in the indicator image,
wherein the corresponding relationship between that said one of the first data blocks and that said one of the second data blocks indicates a difference between a first segment value of that said one of the first data blocks and a second segment value of that said one of the second data blocks,
wherein the processing device is further configured to determine a complete set of graphical micro-units belonging to the first content data part by determining further one or more of the first data blocks according to the corresponding relationship and further one or more of the second data blocks,
wherein the further one or more of the first data blocks and the further one or more of the second data blocks have consistent further positions regarding the first content data part and the second content data part, wherein the further one or more of the first data blocks are not captured in the indicator image, and the further one or more of the second data blocks are captured in the indicator image, wherein the difference between the first segment value of each of the further one or more of the first data blocks and the second segment value of each of the further one or more of the first data blocks is indicated by the corresponding relationship, wherein the first content data part is different from the second content data part, and the first indicator and the second indicator are different, wherein the complete set of graphical micro-units belonging to the first content data part is further used to obtain the first indicator data corresponding to the first graphical indicator.

13. The electronic apparatus according to claim 12, wherein each of the content data parts comprises a plurality of data blocks, each of the data blocks has one of the graphical micro-units selectively and respectively configured in one of a plurality of unit positions of the data block to indicate a segment value, and the indicator data is combined by the segment values; and each of the header parts comprises a plurality of the graphical micro-units, and the graphical micro-units are arranged in a predetermined manner to provide header information for identifying the graphical indicator, wherein according to the relative position relationship between the first graphical indicator and the second graphical indicator in the indicator structure, the segment values indicated by the data blocks having consistent positions in the first graphical indicator and in the second graphical indicator have the corresponding relationship.

14. The electronic apparatus according to claim 13, wherein each of the header parts defines a distribution area of the graphical micro-units belonging to the content data part in each of the graphical indicators.

15. The electronic apparatus according to claim 13, wherein the data block in each of the content data parts is a parity check block, and the segment value indicated by the data block is a bit check value used to perform a parity check on the indicator data corresponding to the graphical indicator.

16. The electronic apparatus according to claim 15, wherein the processing device further determines whether the indicator data in the first graphical indicator passes the parity check according to the parity check block in the first graphical indicator or the parity check block in the second graphical indicator.

17. The electronic apparatus according to claim 13, wherein the data block in each of the content data parts is a cyclic redundancy check block, and the segment value indicated by the data block is an error-detecting code used to perform an error detection on the indicator data corresponding to the graphical indicator.

18. The electronic apparatus according to claim 13, wherein the image capture device comprises a charge-coupled device (CCD) or a complementary metal-oxide semiconductor (CMOS) image sensor, and the coverage of the indicator image captured by the image capture device is at least greater than one of the graphical indicators.

* * * * *